(12) United States Patent
Chen et al.

(10) Patent No.: US 11,508,737 B2
(45) Date of Patent: *Nov. 22, 2022

(54) SRAM CELL AND LOGIC CELL DESIGN

(71) Applicant: Taiwan Semiconductor Manufacturing Co., Ltd., Hsinchu (TW)

(72) Inventors: Fang Chen, Hsinchu (TW); Kuo-Chiang Ting, Hsinchu (TW); Jhon Jhy Liaw, Zhudong Township (TW); Min-Chang Liang, Zhu-Dong Town (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 232 days.

This patent is subject to a terminal disclaimer.

(21) Appl. No.: 16/910,498

(22) Filed: Jun. 24, 2020

(65) Prior Publication Data
US 2020/0395366 A1 Dec. 17, 2020

Related U.S. Application Data

(60) Continuation of application No. 16/591,816, filed on Oct. 3, 2019, now Pat. No. 10,720,436, which is a continuation of application No. 16/051,199, filed on Jul. 31, 2018, now Pat. No. 10,468,418, which is a
(Continued)

(51) Int. Cl.
*H01L 27/11* (2006.01)
*H01L 27/11582* (2017.01)
*H01L 49/02* (2006.01)
*H01L 21/8238* (2006.01)
*H01L 23/522* (2006.01)
(Continued)

(52) U.S. Cl.
CPC .. *H01L 27/1104* (2013.01); *H01L 21/823821* (2013.01); *H01L 23/528* (2013.01); *H01L 23/5226* (2013.01); *H01L 27/0886* (2013.01); *H01L 27/1116* (2013.01); *H01L 27/11582* (2013.01); *H01L 28/00* (2013.01)

(58) Field of Classification Search
CPC ......... H01L 27/1104; H01L 21/823821; H01L 23/5226; H01L 23/528; H01L 27/0886; H01L 27/1116; H01L 27/11582; H01L 28/00; G11C 11/412; G11C 11/417
USPC ........................................................ 257/369
See application file for complete search history.

(56) References Cited

U.S. PATENT DOCUMENTS

| 8,198,655 B1 | 6/2012 | Pileggi et al. |
| 8,421,205 B2 | 4/2013 | Yang |
| 8,661,389 B2 | 2/2014 | Chern et al. |

(Continued)

FOREIGN PATENT DOCUMENTS

CN 103151070 A 6/2013

*Primary Examiner* — Caleen O Sullivan
(74) *Attorney, Agent, or Firm* — Slater Matsil, LLP

(57) ABSTRACT

An embodiment is an integrated circuit structure including a static random access memory (SRAM) cell having a first number of semiconductor fins, the SRAM cell having a first boundary and a second boundary parallel to each other, and a third boundary and a fourth boundary parallel to each other, the SRAM cell having a first cell height as measured from the third boundary to the fourth boundary, and a logic cell having the first number of semiconductor fins and the first cell height.

20 Claims, 17 Drawing Sheets

Related U.S. Application Data division of application No. 15/170,562, filed on Jun. 1, 2016, now Pat. No. 10,050,042.

(60) Provisional application No. 62/288,942, filed on Jan. 29, 2016.

(51) Int. Cl.
  *H01L 23/528* (2006.01)
  *H01L 27/088* (2006.01)

(56) References Cited

U.S. PATENT DOCUMENTS

| | | |
|---|---|---|
| 8,698,205 B2 | 4/2014 | Tzeng et al. |
| 8,826,212 B2 | 9/2014 | Yeh et al. |
| 8,836,141 B2 | 9/2014 | Chi et al. |
| 9,424,889 B1 | 8/2016 | Liaw |
| 10,050,042 B2 | 8/2018 | Chen et al. |
| 10,468,418 B2 * | 11/2019 | Chen .................. H01L 27/0886 |
| 2014/0153321 A1 | 6/2014 | Liaw |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |
| 2014/0374831 A1 | 12/2014 | Liaw |

* cited by examiner

SRAM CELL AND LOGIC CELL DESIGN

PRIORITY CLAIM

This application is a continuation of U.S. application Ser. No. 16/591,816 filed on Oct. 3, 2019, which is a continuation of U.S. application Ser. No. 16/051,199, filed on Jul. 31, 2018, now U.S. Pat. No. 10,468,418, issued on Nov. 5, 2019, which is a divisional of U.S. patent application Ser. No. 15/170,562, filed on Jun. 1, 2016, now U.S. Pat. No. 10,050,042, issued on Aug. 14, 2018, which claims priority to U.S. Provisional Application No. 62/288,942, filed on Jan. 29, 2016 and entitled "SRAM and Logic Design" which applications are hereby incorporated by reference herein as if reproduced in their entireties.

BACKGROUND

Static random access memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
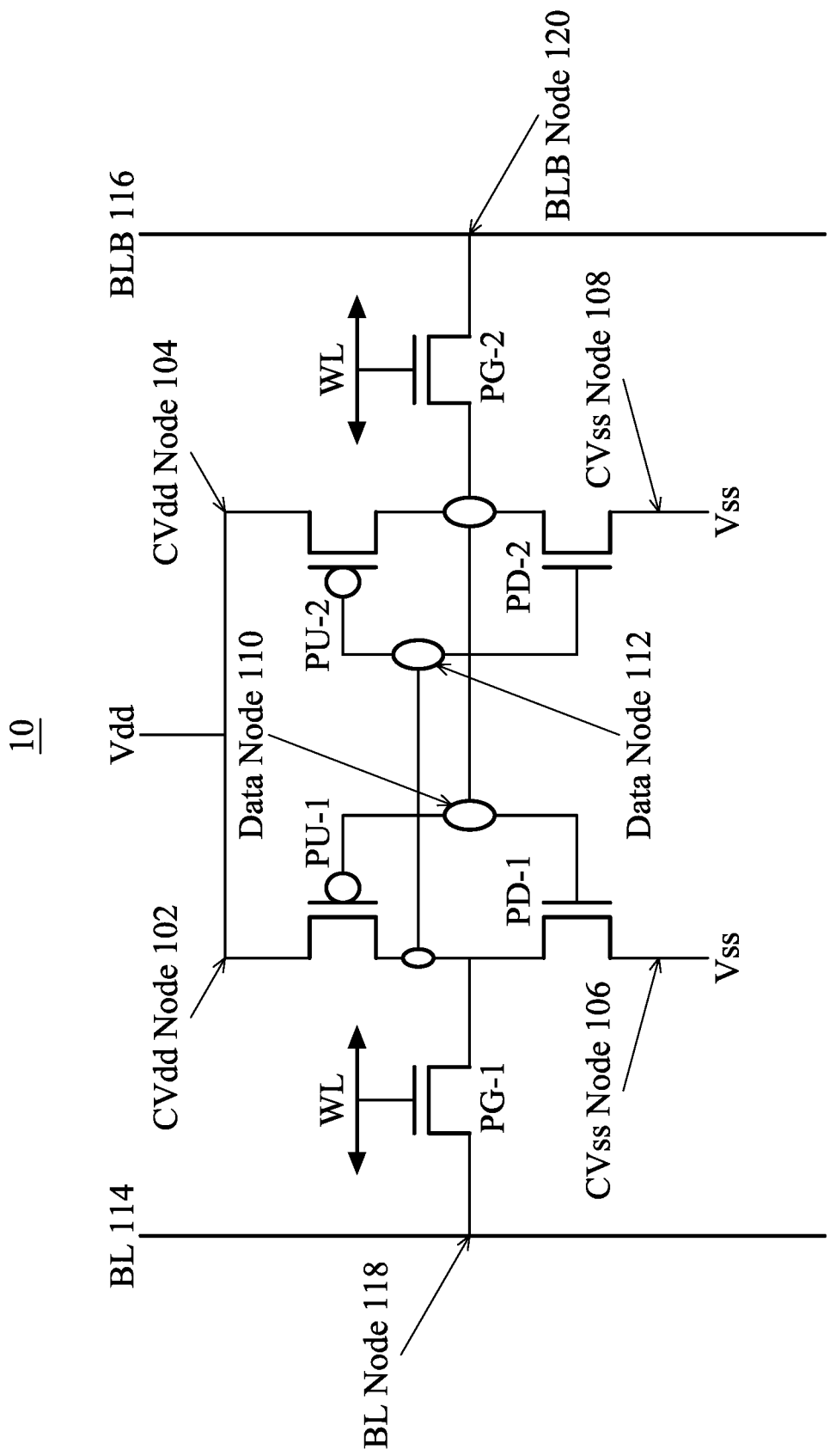
FIGS. 1 and 2 illustrate circuit diagrams of a static random access memory (SRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) cell, the corresponding SRAM array, and an example logic cell are provided in accordance with various exemplary embodiments. Some variations of some embodiments are discussed. Throughout the various views and illustrative embodiments, like reference numbers are used to designate like elements. Furthermore, although various embodiments are described in a particular context of a six transistor (6T) SRAM cell, other embodiments may also be applied to other SRAM memory cell configurations, such as, eight transistor (8T) SRAM cells, ten transistor (10T) SRAM cells, dual-port SRAM cells, or the like. Further, the aspects of the disclose embodiments may be applied to other types of memory cell configurations, such as, magnetoresistive random-access memory (MRAM), dynamic random access memory (DRAM), resistive random access memory (RRAM), or the like. Moreover, although various embodiments are described in a particular context of an inverter logic cell, other embodiments may also be applied to other logic cell configurations, such as, NAND gates, NOR gates, multiplexers, latches, flip-flops, or the like.

According to embodiments disclosed herein, SRAM memory cell layouts and logic cell layouts having synchronized cell designs are presented to shorten the learning cycle for module process development for a new technology node. For example, the synchronization of the cell design may include synchronizing the cell heights, synchronizing the pattern designs for layers, and/or synchronizing the number of fins per cell. This synchronization of the cell designs between memory cells and logic cells shortens the module process development time, makes it easier to leverage technical knowledge between memory and logic cells, and makes it easier to maintain yield during production due to similar designs of memory and logic cells.

Referring to FIG. 1, FIG. 1 illustrates a circuit diagram of SRAM cell 10 in accordance with some embodiments. SRAM cell 10 includes pull-up transistors PU-1 and PU-2, which are P-type Metal-Oxide-Semiconductor (PMOS) transistors, and pull-down transistors PD-1 and PD-2 and pass-gate transistors PG-1 and PG-2, which are N-type Metal-Oxide-Semiconductor (NMOS) transistors. The gates of pass-gate transistors PG-1 and PG-2 are controlled by a word line (WL) that determines whether SRAM cell 10 is selected or not. A latch formed of pull-up transistors PU-1 and PU-2 and pull-down transistors PD-1 and PD-2 stores a bit, wherein the complementary values of the bit are stored in storage data (SD) node 110 and SD node 112. The stored bit can be written into, or read from, SRAM cell 10 through complementary bit lines including bit line (BL) 114 and bit line bar (BLB) 116. SRAM cell 10 is powered through a positive power supply node Vdd that has a positive power supply voltage (also denoted as CVdd). SRAM cell 10 is also connected to power supply voltage Vss (also denoted as CVss), which may be an electrical ground. Transistors PU-1 and PD-1 form a first inverter. Transistors PU-2 and PD-2 form a second inverter. The input of the first inverter is connected to transistor PG-1 and the output of the second inverter. The output of the first inverter is connected to transistor PG-2 and the input of the second inverter.

The sources of pull-up transistors PU-1 and PU-2 are connected to CVdd node 102 and CVdd node 104, respectively, which are further connected to power supply voltage (and line) Vdd. The sources of pull-down transistors PD-1 and PD-2 are connected to CVss node 106 and CVss node 108, respectively, which are further connected to power supply voltage/line Vss. The gates of transistors PU-1 and PD-1 are connected to the drains of transistors PU-2 and PD-2, which form a connection node that is referred to as SD node 110. The gates of transistors PU-2 and PD-2 are connected to the drains of transistors PU-1 and PD-1, which connection node is referred to as SD node 112. A source/drain region of pass-gate transistor PG-1 is connected to bit line BL 114 at a BL node 118. A source/drain region of pass-gate transistor PG-2 is connected to bit line BLB 116 at a BLB node 120.

Figure 2:
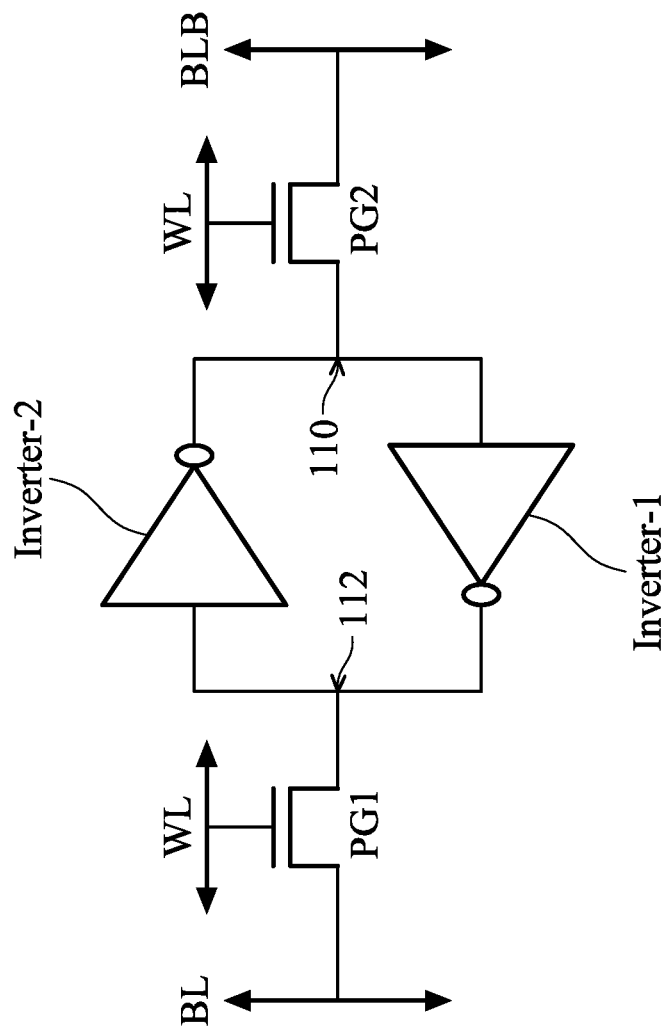

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 (e.g., corresponding to SD node 112) is connected to transistor PG-1 and the input of the second inverter Inverter-2. The output of second inverter Inverter-2 (e.g., corresponding to SD node 110) is connected to transistor PG-2 and the input of first inverter Inverter-1. Thus, transistors PU-2/PD-2 and PU-1/PD-1 form a pair of cross-connected inverters Inverter-1 and Inverter-2.

Figure 3:
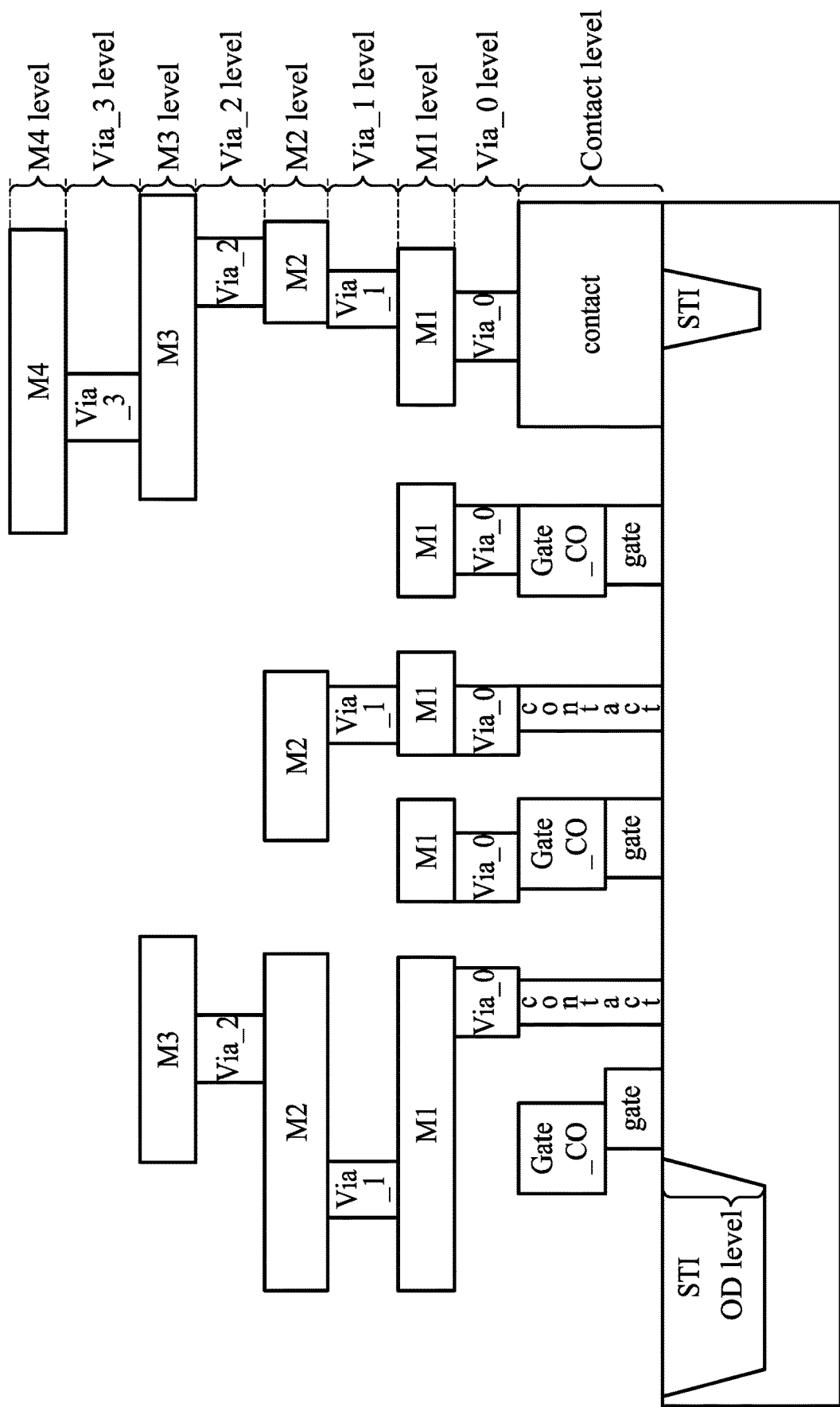
FIG. 3 illustrates a cross-sectional view of the layers involved in an SRAM cell array and logic cells in accordance with some embodiments.

FIG. 3 illustrates a schematic cross-sectional view of a plurality of layers involved in SRAM cell 10 and logic cells, which layers are formed on a semiconductor chip or wafer. It is noted that FIG. 3 is schematically illustrated to show various levels of interconnect structure and transistors, and may not reflect the actual cross-sectional view of SRAM cell 10. The interconnect structure includes an active region level, a contact level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Figure 4:
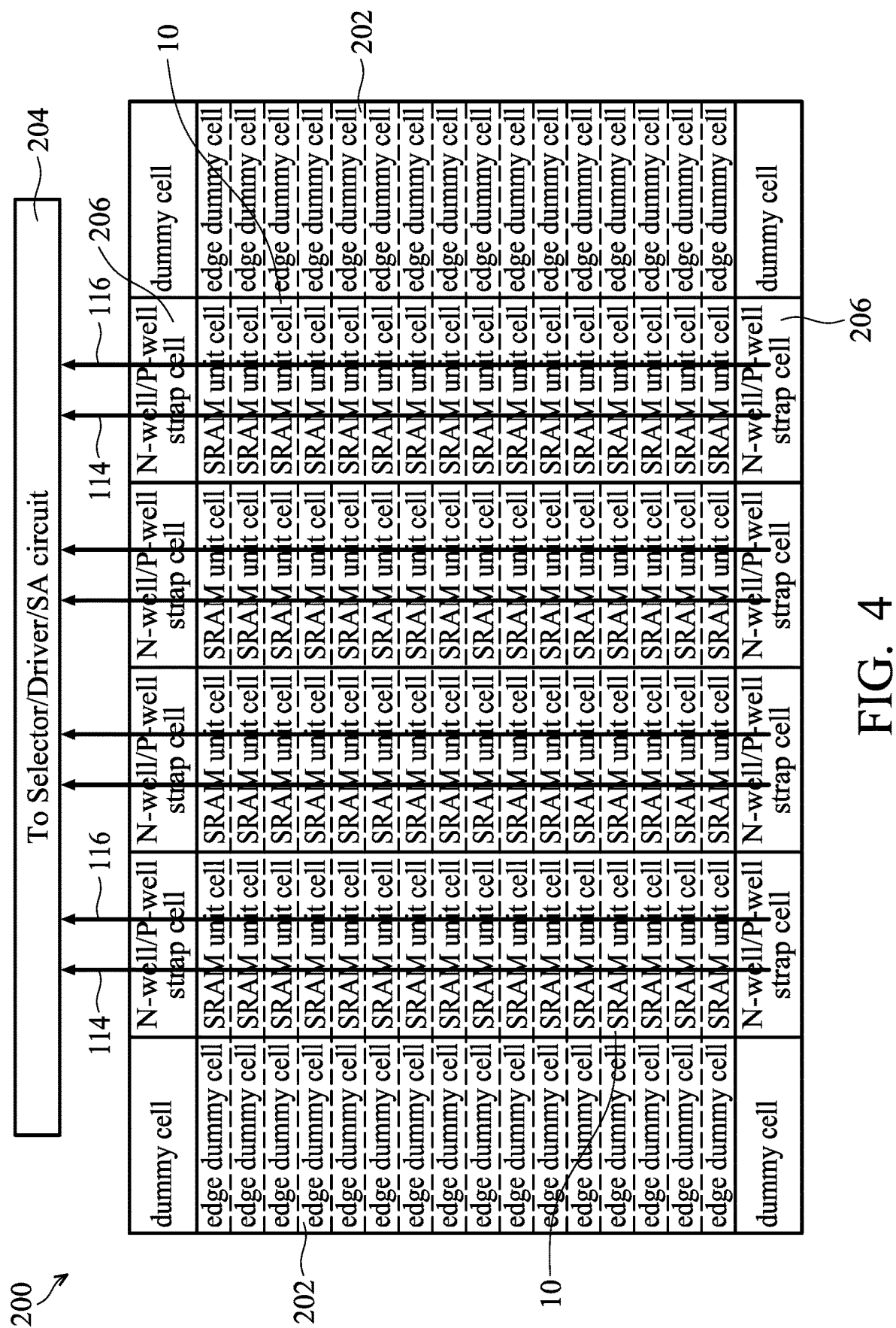
FIG. 4 illustrates a block diagram of an SRAM array in accordance with some embodiments.

Generally, multiple SRAM cells are arranged in a semiconductor die as a SRAM array. FIG. 4 illustrates a block diagram of SRAM array 200 according to some embodiments. SRAM array 200 includes a plurality of memory cells (SRAM cells 10). In some embodiments, the SRAM array 200 is divided into multiple SRAM sub-arrays (not shown). In an embodiment, each SRAM cell 10 in SRAM array 200 has a circuit layout as described above with respect to FIGS. 1 through 3. Other SRAM circuit layouts may be used in other embodiments. For example, FIGS. 1 through 3 illustrate a six transistor (6T) SRAM circuit layout. Other embodiments may include SRAM cells 10 having a different number of transistors, such as an eight transistor (8T) SRAM circuit layout, a ten transistor (10T) SRAM circuit layout, and various embodiments are not limited to a particular memory cell circuit.

SRAM cells 10 in the SRAM array 200 may be arranged in rows and columns. In an embodiment, the SRAM array 200 may include at least four columns by 16 rows (denoted as "4×16") of SRAM cells, such as, 64×64 SRAM cells, 128×128 SRAM cells, 256×256 SRAM cells, or the like. In the embodiment with SRAM sub-arrays, number of SRAM cells in each of the SRAM sub-arrays may be the same or different from the number of SRAM cells in the other SRAM sub-arrays. However, the number of columns in each of the SRAM sub-arrays is generally the same. Other embodiments may include memory arrays having a different number of memory cells, such as fewer or more memory cells.

Generally, SRAM cells 10 in a same column and SRAM array 200 share a common BL 114 and a BLB 116. For example, each SRAM cell 10 in a same column and SRAM array 200 includes a portion of a BL 114 and BLB 116, which when combined with other SRAM cells 10 in the column and SRAM array 200 forms continuous conductive lines (the BL and the BLB). BLs 114 and BLBs 116 are electrically connected to control circuitry 204, which activates certain BLs 114 and/or BLBs 116 to select a particular column in SRAM array 200 for read and/or write operations. In some embodiments, control circuitry 204 may further include amplifiers to enhance a read and/or write signal. For example, control circuitry 204 may include selector circuitry, driver circuitry, sense amplifier (SA) circuitry, combinations thereof, and the like. In some embodiments, the control circuitry 204 includes one or more logic cells that have a same cell height as the SRAM cells 10 in the SRAM array 200, with the cell height being measured perpendicular to the longitudinal axes of the BL 114 and the BLB 116. In the embodiment with multiple SRAM sub-arrays, there may be a different control circuitry 204 for each of the SRAM sub-arrays.

As further illustrated by FIG. 4, SRAM array 200 may further include dummy cells around a periphery of the SRAM cells 10 of the SRAM array 200. For example, each row of SRAM array 200 may begin and end with an edge dummy cell 202. The edge dummy cells 202 may have the same configuration and the same size as SRAM cells 10. The edge dummy cells 202 may have any suitable configuration and may be included for improved uniformity of fins and/or metal features. As another example, each column of SRAM array 200 may begin and end with an N-well/P-well strap cell 206. The N-well/P-well strap cells 206 may have any suitable configuration and may be included to prevent SRAM cells 10 from directly abutting against isolation regions (e.g., STI regions) at the active region level of the semiconductor die. For example, the N-well/P-well strap cells 206 may include dummy gate electrodes and/or dummy fin structures. Gate and/or source/drain contacts may be provided to the dummy gates and/or dummy source/drain regions in N-well/P-well strap cells 206 to provide a dense environment for manufacturing margin improvement.

FIGS. 5A through 5I illustrate a layout of features of a memory cell (e.g., SRAM cell 10) according to some embodiments. FIGS. 5A through 5I illustrates features in different levels of SRAM cell 10 (e.g., active region level, contact level, via_0 level, M1 level, via-1 level, M2 level, see FIG. 3), which are consecutively described for clarity.

Figure 5A:
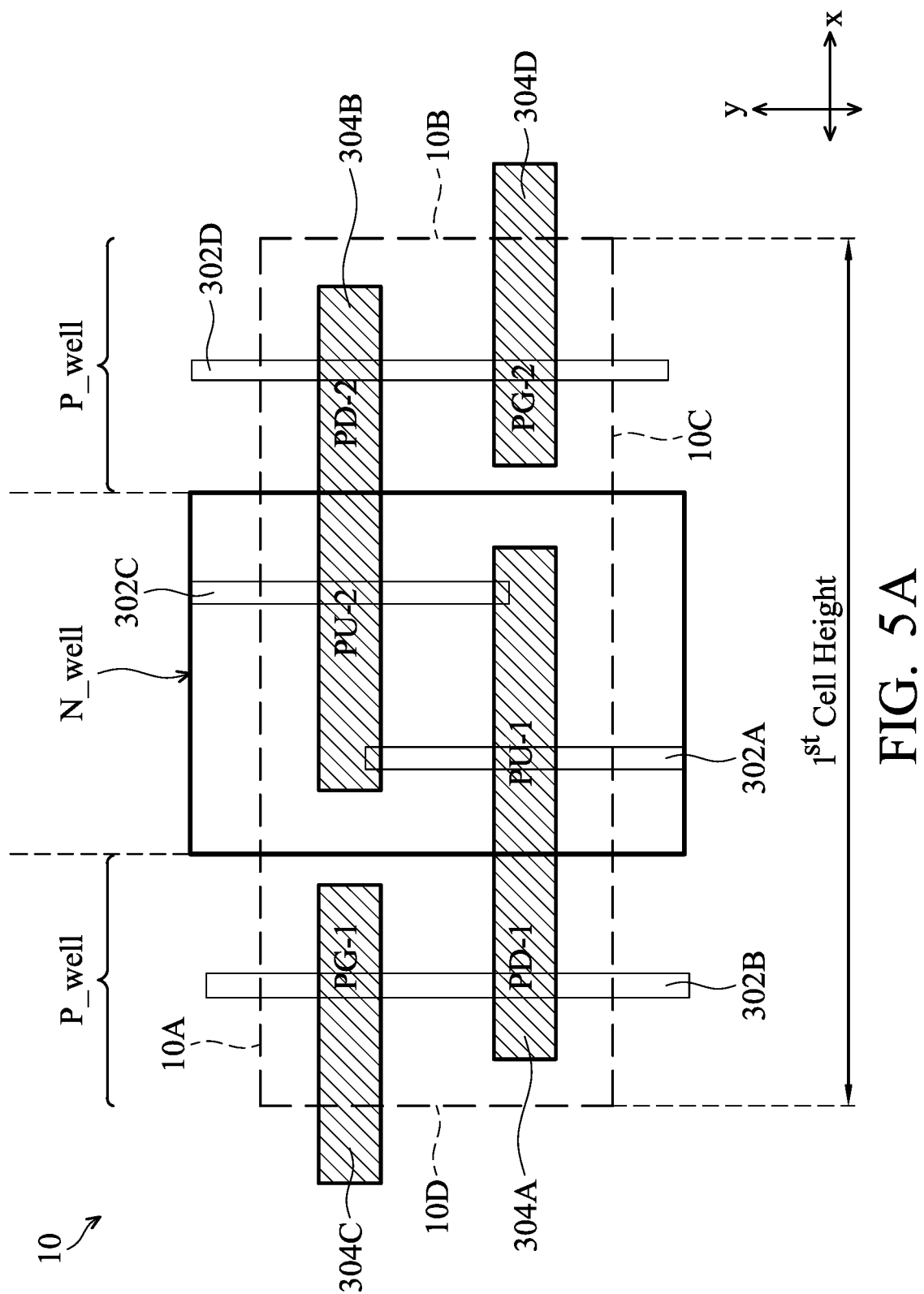
FIGS. 5A through 5I illustrate an SRAM cell layout in accordance with some embodiments.

Referring first to FIG. 5A, features in the active region level (FIG. 3) and overlying gate electrodes of various transistors in SRAM cell 10 are illustrated. The outer boundaries 10A, 10B, 10C, and 10D of SRAM cell 10 are illustrated using dashed lines, which mark a rectangular region. The active region level includes a substrate, isolation regions, and well regions. In some embodiments, an N-well region is in the middle of SRAM cell 10, and two P-well regions are on opposite sides of the N-well region. The substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The well regions may be formed in the substrate. For example, the P-well regions may be formed in the substrate, and the N-well region may be formed between the P-well regions in the substrate.

The different implant steps for the different wells may be achieved using a photoresist or other masks (not shown). For example, a photoresist is formed and patterned to expose the region the substrate to be implanted. The photoresist can be formed by using a spin-on technique and can be patterned using acceptable photolithography techniques. Once the photoresist is patterned, an n-type impurity and/or a p-type impurity implant is performed in the exposed region, and the photoresist may act as a mask to substantially prevent the impurities from being implanted into the masked region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

After the implants of the well regions, an anneal may be performed to activate the p-type and/or n-type impurities that were implanted. In some embodiments, substrate may include epitaxially grown regions that may be in situ doped during growth, which may obviate the implantations, although in situ and implantation doping may be used together.

Gate electrode 302A forms pull-up transistor PU-1 with an underlying active region 302A in N-well region. In an embodiment, active region 302A is fin-based and includes one or more fin structures disposed under gate electrode 304A (e.g., gate electrode 304A may be disposed over and extend along sidewalls of active region 606A). Gate electrode 304A further forms pull-down transistor PD-1 with underlying active region 302B in a first P-well region (e.g., on a first side of the N-well region). In an embodiment, active region 302B is fin-based and includes one or more continuous fin structures disposed under gate electrode 304A (e.g., gate electrode 304A may be disposed over and extend along sidewalls of active region 302B). Gate electrode 304C forms pass-gate transistor PG-1 with active region 302B. In an embodiment, gate electrode 304C is disposed over and extends along sidewalls of active region 302B.

As further illustrated by FIG. 5A, gate electrode 304B forms pull-up transistor PU-2 with an underlying active region 302C in the N-well region. In an embodiment, active region 302C is fin-based and includes one or more fin structures disposed under gate electrode 304B (e.g., gate electrode 304B may be disposed over and extend along sidewalls of active region 302C). Gate electrode 304B further forms pull-down transistor PD-2 with an underlying active region 302D in a second P-well region (e.g., on a second side of the N-well region). In an embodiment, active region 302D is fin-based and includes one or more fin structures disposed under gate electrode 304B (e.g., gate electrode 304B may be disposed over and extend along sidewalls of active region 302D). Gate electrode 304D forms pass-gate transistor PG-2 with underlying active region 302D. In an embodiment, gate electrode 304D is disposed over and extends along sidewalls of active region 302D.

In accordance with some embodiments of the present disclosure, pass-gate transistors PG-1 and PG-2, pull-up transistors PU-1 and PU-2, and pull-down transistors PD-1 and PD-2 are Fin Field-Effect Transistors (FinFETs) as described above where active regions 302A through 302D include one or more fin structures. In accordance with alternative embodiments of the present disclosure, one or more of the pass-gate transistors PG-1 and PG-2, pull-up transistors PU-1 and PU-2, and pull-down transistors PD-1 and PD-2 are planar MOS devices having active regions doped in an upper surface of a semiconductor substrate. FIG. 5A illustrates a single fin for each active region 302A through 302D in accordance with some embodiments. In accordance with other embodiments, there may be a single fin, two fins, three fins, or more for each active region 302A through 302D, and the number of fins in each active region 302A through 302D may be the same or different as other active regions in SRAM cell 10.

The active regions 302A through 302D are formed in a semiconductor substrate. This step may comprise forming shallow trench isolations (STIs) (see FIG. 3) around each active region. The active regions 302A through 302D may be doped with the appropriate n-type or p-type dopants to create n-wells or p-wells for PMOS or NMOS transistors, respectively. Processing may require forming and patterning resist layers in order to form the STIs and the n-wells and p-wells as is known in the art. Alternatively, if FinFETs are to be formed, this step may comprise forming STIs and etching and doping the semiconductor substrate to form the FinFET active regions 302A through 302D.

In the FinFET embodiments, the fins may be formed in various different processes. In one example, the fins can be formed by etching trenches in a substrate to form semiconductor strips; the trenches can be filled with a dielectric layer; and the dielectric layer can be recessed such that the semiconductor strips protrude from the dielectric layer to form fins. In another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In still another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium (SixGe1-x, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The formation of the gates 304A through 304D may include forming a dielectric layer, such as silicon dioxide, may be formed over the semiconductor substrate. The gate dielectric layer (not shown) may be formed by thermal oxidation, chemical vapor deposition (CVD), sputtering, or any other methods known and used in the art for forming a gate dielectric. In some embodiments, the gate dielectric layer includes dielectric materials having a high dielectric constant (k value), for example, greater than 3.9. The gate dielectric materials include silicon nitrides, oxynitrides, metal oxides such as $HfO_2$, $HfZrO_x$, $HfSiO_x$, $HfTiO_x$, $HfAlO_x$, the like, or combinations and multi-layers thereof.

After the formation of the gate dielectric layer, a gate electrode layer is formed over the gate dielectric layer. This gate electrode layer may include a conductive material and may be selected from a group comprising polycrystalline-silicon (polysilicon), poly-crystalline silicon-germanium (poly-SiGe), metallic nitrides, metallic silicides, metallic oxides, and metals. The gate electrode layer may be deposited by physical vapor deposition (PVD), CVD, sputter deposition, or other techniques known and used in the art for depositing conductive materials. After deposition, a top surface of the gate electrode layer usually has a non-planar top surface, and may be planarized, for example, by a chemical mechanical polishing (CMP) process, prior to patterning of the dummy gate electrode layer or gate etch. Ions may or may not be introduced into the gate electrode layer at this point. Ions may be introduced, for example, by ion implantation techniques. If polysilicon is used, in subsequent steps the gate electrode may be reacted with metal to form a silicide to reduce contact resistance. The gate dielectric layer and the gate electrode layer are then etched such that the layers remain on the active regions 302 to form gate electrodes. Similarly, if FinFETs are used, the gate structures 304 will be formed over and around the active regions 302. Dielectric spacers may be formed along the edges of the gate electrodes, and the gate electrodes may be doped as desired.

After the gates are formed, the source and drain regions for the transistors may be formed. This may involve doping the active areas on either side of the gate for each transistor. Different resist layers may be needed when doping transistors with p-type dopants and when doping transistors with n-type dopants.

Figure 5B:
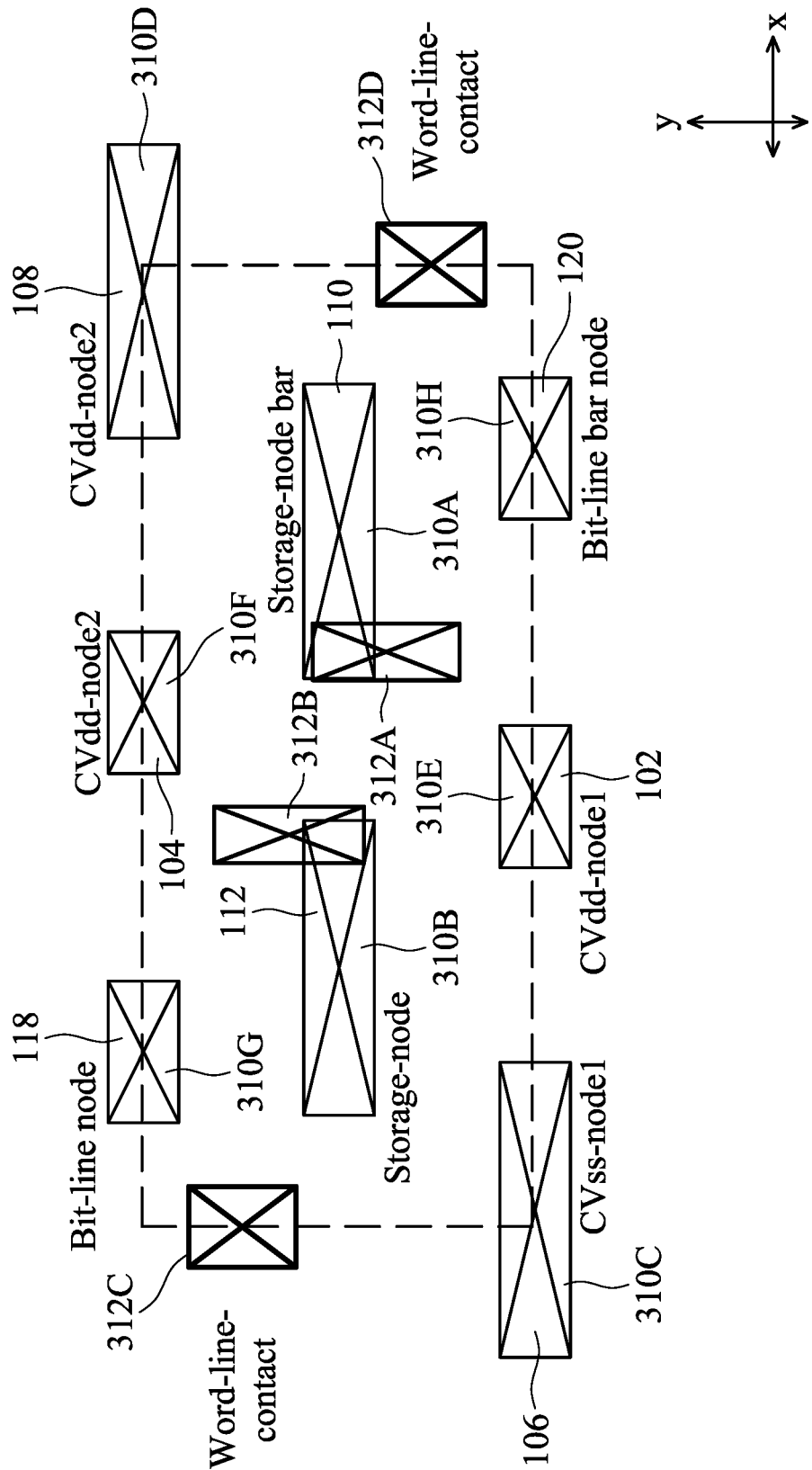
Figure 5C:
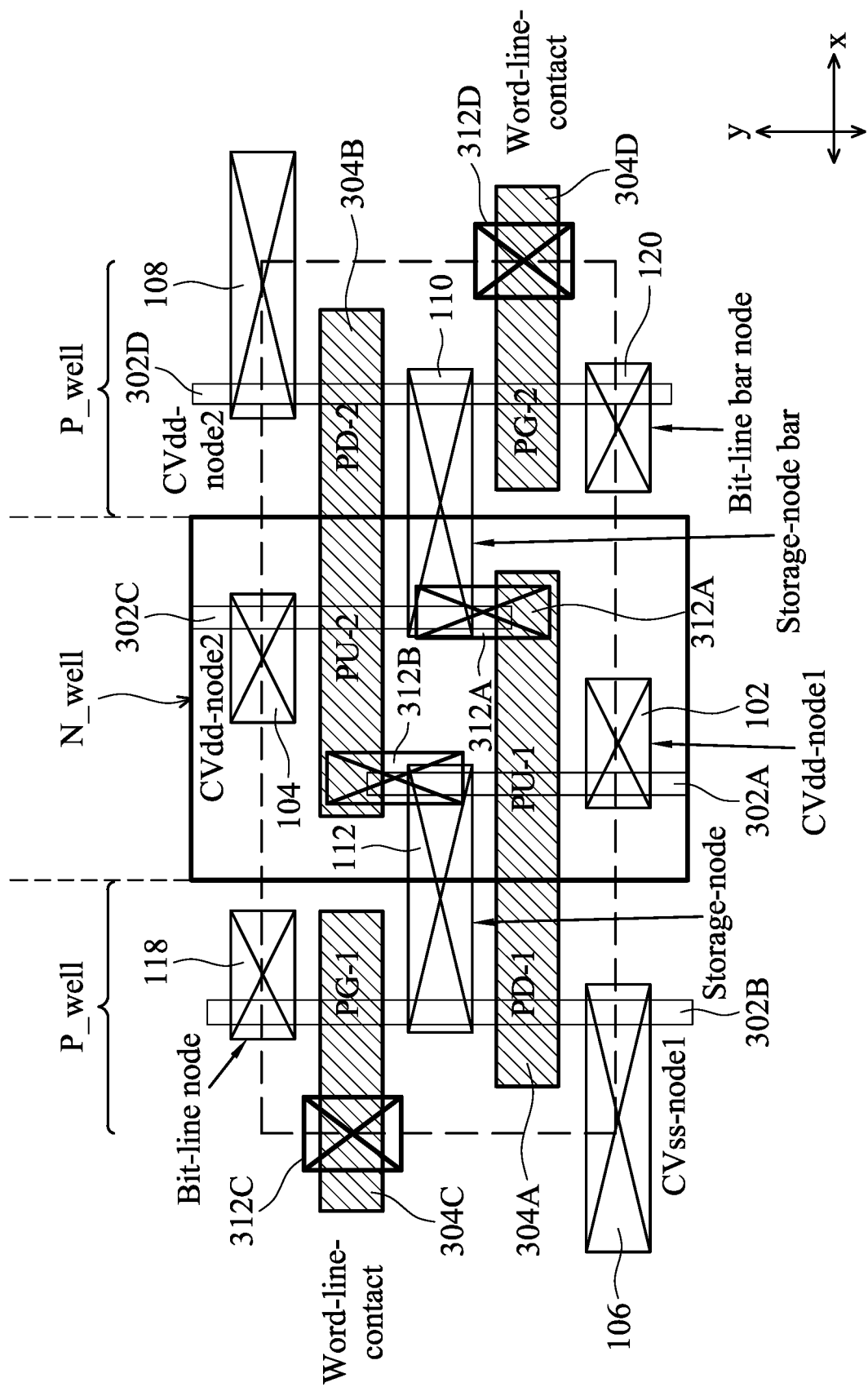

FIG. 5B illustrates conductive features of SRAM cell 10 in the contact level (see FIG. 3) and FIG. 5C illustrates these conductive features in FIG. 5B coupled to the layout of the SRAM cell 10. As shown in FIG. 5B, SD node 110 (see also FIG. 1) includes source/drain contact plug 310A and gate contact plug 312A, which are the features at the contact level of SRAM cell 10 (see FIG. 3). Source/drain contact plug 310A is elongated and has a longitudinal direction in the X direction, which is parallel to the extending directions of gate electrodes 304A and 304B. Gate contact plug 312A comprises a portion over, and is electrically connected to, gate electrode 304A. In accordance with some embodiments of the present disclosure, gate contact plug 312A has a longitudinal direction in the Y direction, with is perpendicular to the X direction. In the manufacturing of the SRAM cell 10 on physical semiconductor wafers, contact plugs 310A and 312A may be formed as a single continuous butted contact plug.

SD node 112 includes source/drain contact plug 310B and gate contact plug 312B. Gate contact plug 312B has a portion overlapping source/drain contact plug 310B. Since SD node 110 may be symmetric to SD node 112, the details of gate contact plug 312B and source/drain contact plug 310B may be similar to gate contact plug 312A and source/drain contact plug 310A, respectively, and are not repeated herein for simplicity.

FIG. 5B also illustrates gate contacts 312C and 312D connected to gate electrodes 304C and 304D, respectively, which may be used to electrically couple gate electrodes 304C and 304D to one or more WLs as described in greater detail below.

Furthermore, elongated contact plugs 310C and 310D are used to connect to the source regions of pull-down transistors PD-1 and PD-2, respectively, to CVss lines (e.g., electrical ground lines). Elongated contact plugs 310C and 310D are parts of the CVss nodes 106 and 108, respectively (see also FIG. 1). Elongated contact plugs 310C and 310D have lengthwise directions parallel to the X direction, and may be formed to overlap the corners of SRAM cell 10. Furthermore, elongated contact plugs 310C and 310D may further extend into neighboring SRAM cells in a different column that abut SRAM cell 10. Elongated contact plugs 310C and 310D may further be shared between two neighboring SRAM cells in different rows that abut each.

Additionally, contact plugs 310E and 310F are used to connect to the source regions of pull-up transistors PU-1 and PU-2, respectively to CVdd lines (e.g., supply voltage lines). Contact plugs 310E and 310F are parts of the CVdd nodes 102 and 104, respectively (see also FIG. 1). Contact plugs 310E and 310F may further be shared between two neighboring SRAM cells in different rows that abut each other.

As further illustrated by FIG. 5B, contact plugs 310G and 310H are used to connect to the source/drain regions of pass-gate transistors PG-1 and PG-2 to a BL and a BLB, respectively. Contact plugs 310G and 310H are parts of the BL node 118 and BLB node 120, respectively (see also FIG. 1). Contact plugs 310G and 310H may further be shared between two neighboring SRAM cells in different rows that abut each other.

The set of contacts in FIG. 5B may be formed by a damascene or dual damascene process where a dielectric layer is formed over the SRAM cell 10 and etched to form openings that will become contacts to the substrate, active regions, or gates. Then, a metal such as copper, aluminum, tungsten, nickel, the like, or a combination thereof may be deposited into the openings to form the contacts. In some embodiments, the contacts are formed in the same process with the subsequently formed metallization layer (M1) (see FIG. 5D).

Figure 5D:
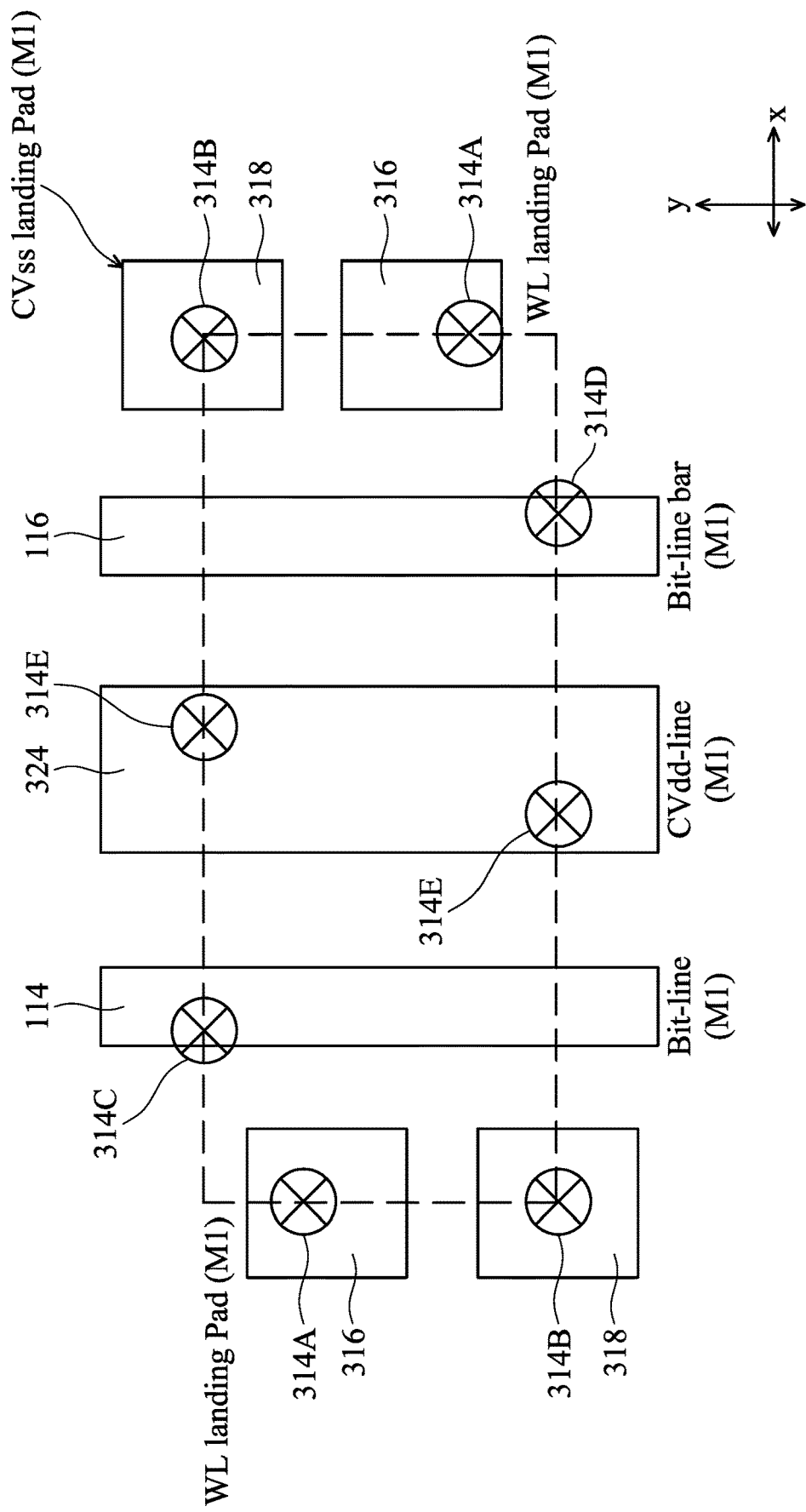
Figure 5E:
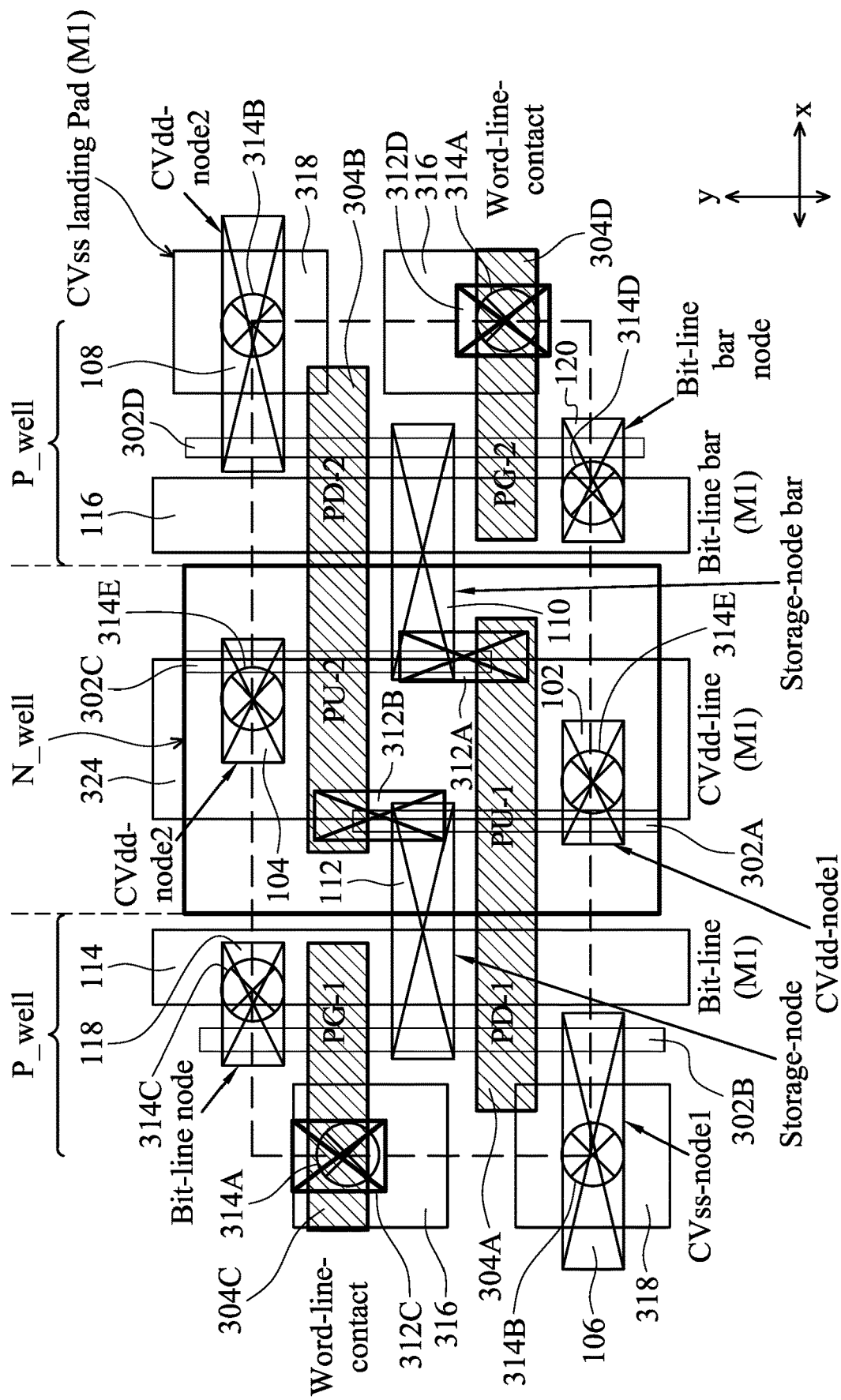

FIG. 5D illustrates features of SRAM cell 10 in the M1 and via_0 levels (see FIG. 3) and FIG. 5E illustrates these conductive features in FIG. 5D coupled to the layout of the SRAM cell 10. In FIG. 5D, vias 314 (labeled 314A through 314E) are disposed in the via_0 level (see FIG. 3) while conductive lines 316, conductive lines 318, BL 114, CVdd line 324, and BLB line 116 are disposed in the M1 level (see FIG. 3). For example, various conductive lines in the M1 level are disposed over various vias in the via_0 level.

As shown in FIGS. 5D and 5E, vias 314A are connected to gate contacts 312C and 312D (e.g., gate contacts for pass-gate transistors PG-1 of PG-2). Vias 314A are further connected to conductive lines 316, which may be used to electrically couple gate electrodes of pass gate transistors PG-1 and PG2 to one or more WLs as described in greater detail with respect to FIGS. 5F and 5G below. Vias 314A and conductive lines 316 may further extend into and shared with neighboring SRAM cells in a different column that abut SRAM cell 10.

Furthermore, vias 314B are connected to elongated contact plugs 310C and 310D (e.g., source contacts of pull-down transistors PD-1 and PD-2). Vias 314B are further connected to conductive lines 318, which may be used to electrically couple sources of pull-down transistors PD-1 and PD2 to CVss lines as described in greater detail with respect to FIGS. 5F through 5I below. Furthermore, vias 314B and conductive lines 318 may further extend into neighboring SRAM cells in a different column that abut SRAM cell 10. Vias 314B and conductive lines 318 may further be shared between two neighboring SRAM cells in different rows that abut each other.

As further illustrated by FIGS. 5D and 5E, vias 314C and 314D are connected to contact plugs 310G and 310H, (e.g., source/drain contacts of pass-gate transistors PG-1 and PG-2), respectively. Vias 314C and 314D are further connected to a BL 114 and a BLB 116, respectively. Thus, vias 314C and 314D are parts of the BL node 118 and BLB node 120, respectively (see also FIG. 1). Vias 314C and 314D may be shared between two neighboring SRAM cells in different rows that abut each other. Furthermore, as described above, SRAM cells in a same column within the SRAM array 200 share a continuous BL and a continuous BLB. For example, the portion of BL 114 and BLB 116 in the illustrated SRAM cell 10 may be connected to portions of BL 114 and BLB 116 in other SRAM cells within the same column to form a continuous BL and a continuous BLB for each row of the SRAM array 200.

Additionally, vias 314E are connected to contact plugs 310E and 310F (e.g., source contacts of pull-up transistors PU-1 and PU-2). Vias 314E are further connected to a CVdd line 324, which electrically connects sources of pull-up transistors PU-1 and PU-2 to CVdd. Thus, vias 314E are parts of the CVdd nodes 102 and 104 (see also FIG. 1). Vias 314E may further be shared between two neighboring SRAM cells in different rows that abut each other. In an embodiment, a single, continuous CVdd line 324 is shared by all SRAM cells in a same column within the SRAM array 200. In some embodiments, the CVdd line 324 has a longitudinal direction in the Y direction.

Figure 5F:
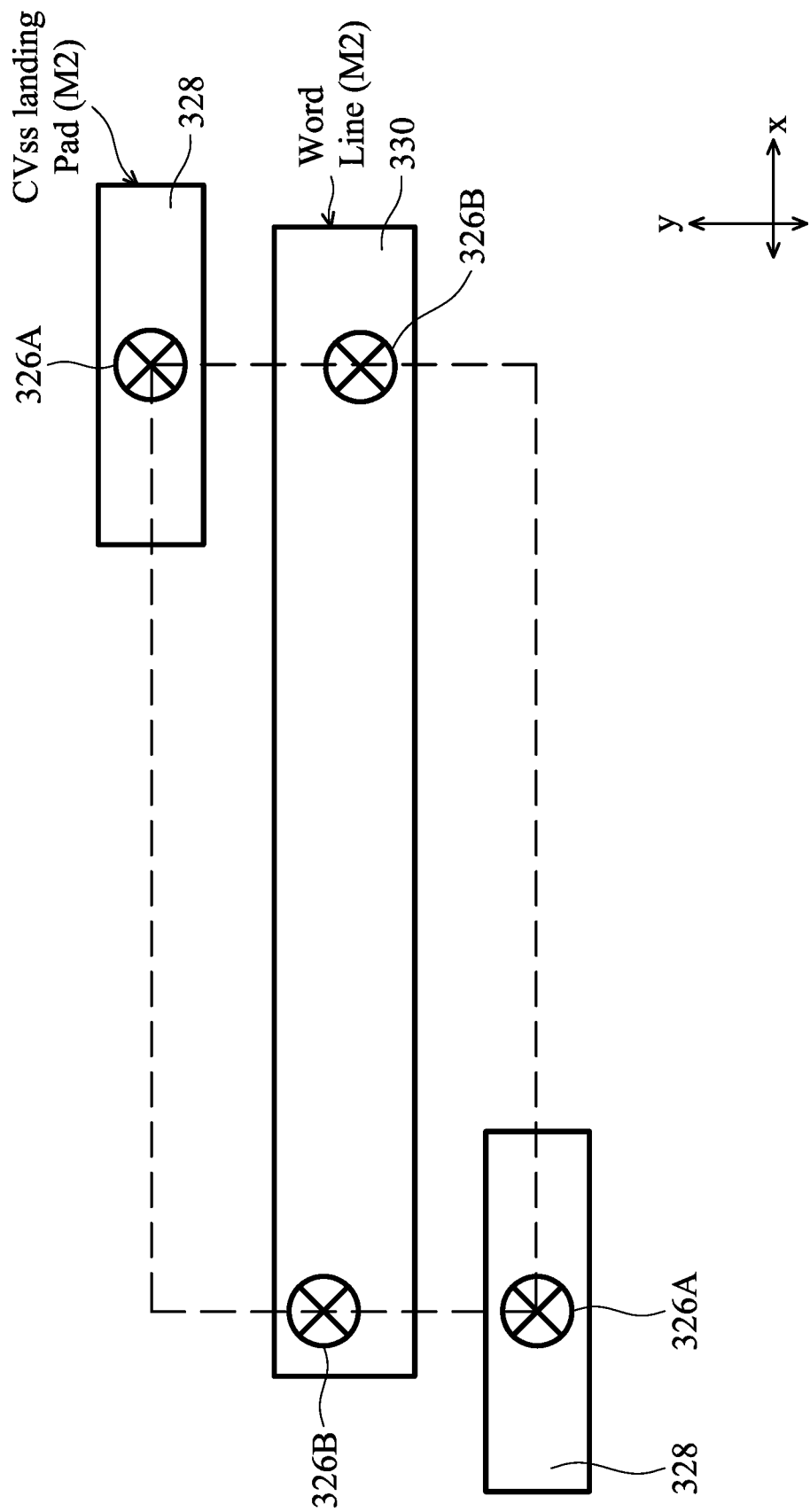
Figure 5G:
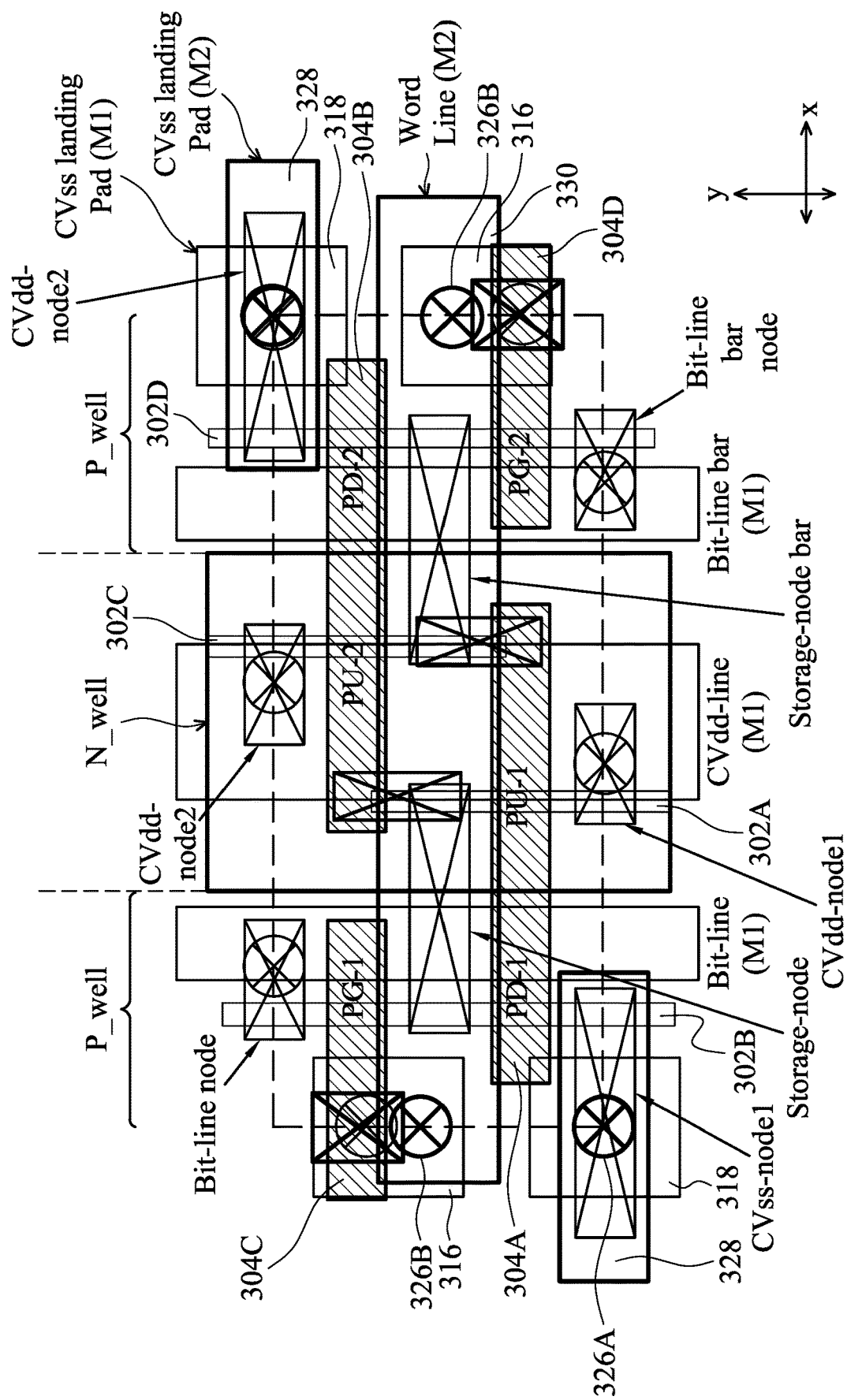

FIG. 5F illustrates features of SRAM cell 10 in the M2 and via_1 levels (see FIG. 3) and FIG. 5G illustrates these conductive features in FIG. 5F coupled to the layout of the SRAM cell 10. In FIGS. 5F and 5G, vias 326 (labeled 326A and 326B) are disposed in the via_1 level (see FIG. 3) while WLs and CVss pads are disposed in the M2 level (see FIG. 3). For example, various conductive lines in the M2 level are disposed over various vias in the via_1 level.

As shown in FIGS. 5F and 5G, vias 326A are connected to conductive lines 318, which electrically connects source contacts 310C and 310D (e.g., source contacts for pull-down transistors PD-1 or PD-2) to CVss pads 328. These CVss pads 328 will be utilized to electrically connect the sources of the pull-down transistors PD-1 and PD-2 to CVss lines (see FIGS. 5H and 5I).

Furthermore, vias 326B are connected to conductive lines 316, which electrically connects gate contacts 312C and 312D (e.g., gate contacts for pass-gate transistors PG-1 of PG-2) to a WL. Thus, SRAM cell 10 includes WL nodes electrically connected to gates of pass-gate transistors. In an embodiment, SRAM cells in a same row share a common, continuous WL, which is used to select or deselect SRAM cells in an array. For example, in order to select a particular SRAM cell, a positive voltage may be applied to a BL/BLB as well as a WL corresponding to the cell. WL nodes may extend into and be shared with neighboring SRAM cells in a different column that abut SRAM cell 10.

Figure 5H:
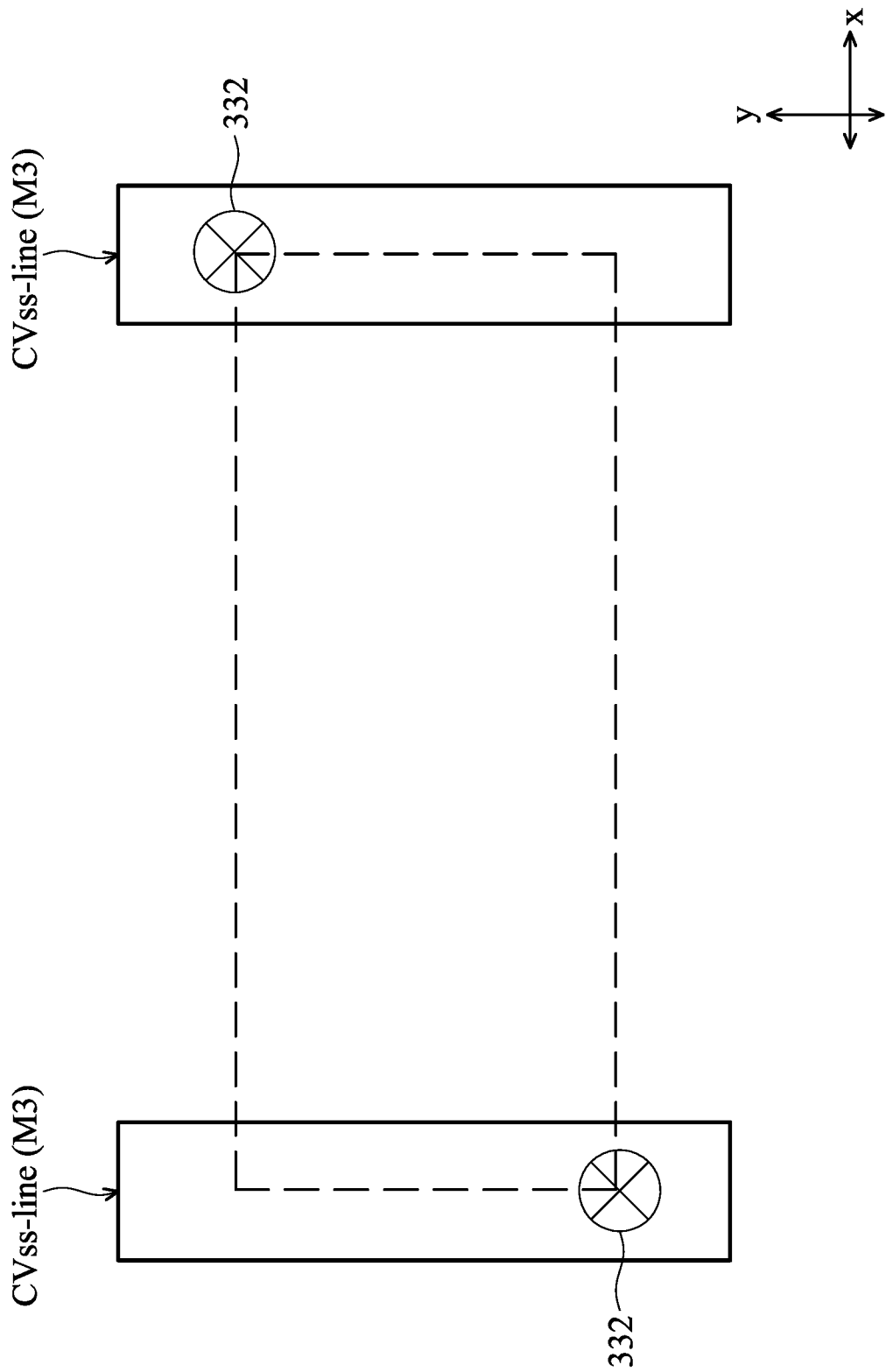
Figure 5:
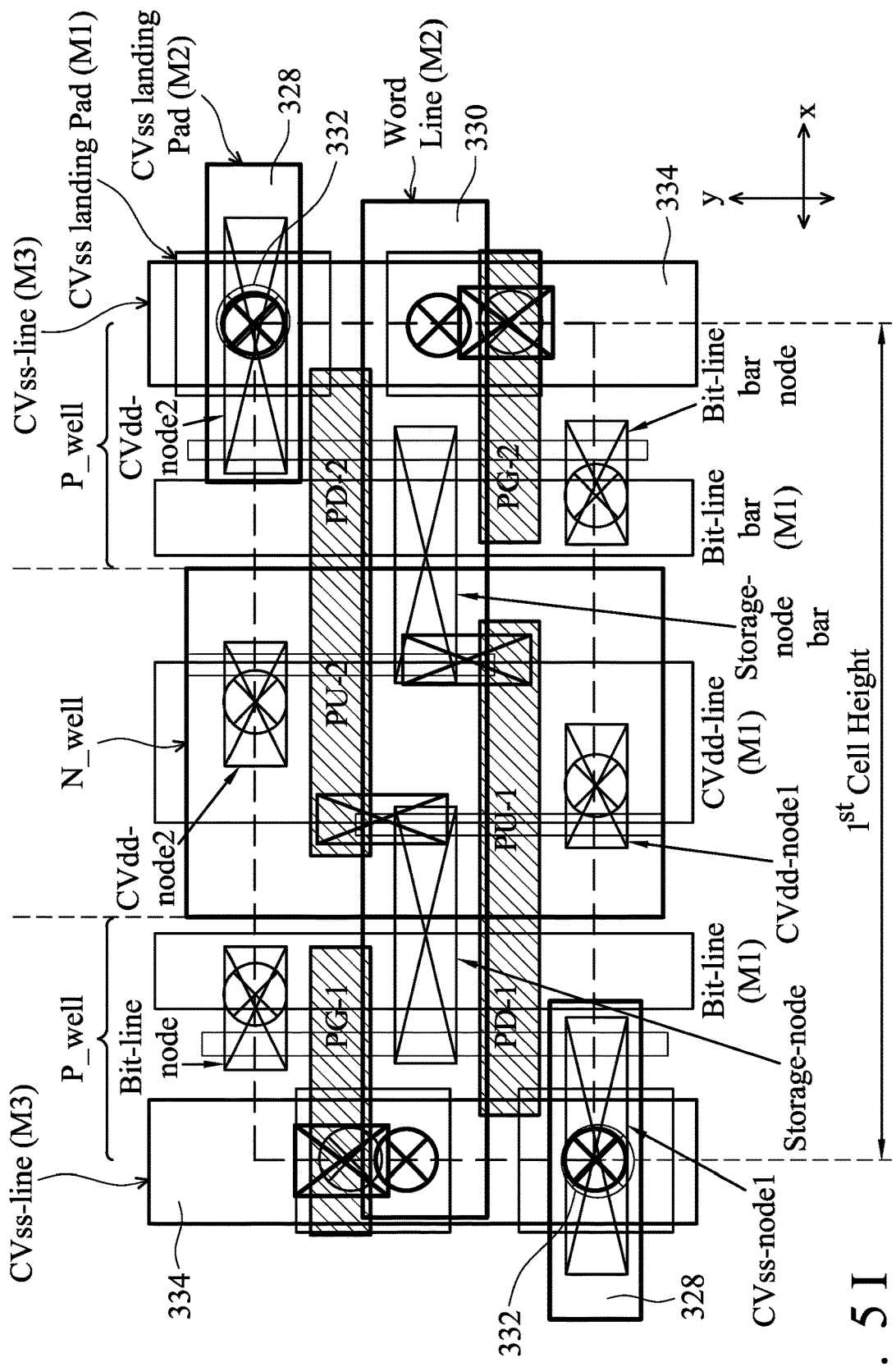

FIG. 5H illustrates features of SRAM cell 10 in the M3 and via_2 levels (see FIG. 3) and FIG. 5I illustrates these conductive features in FIG. 5H coupled to the layout of the SRAM cell 10. In FIGS. 5H and 5I, vias 332 (are disposed in the via_2 level (see FIG. 3) while CVss lines are disposed in the M3 level (see FIG. 3). For example, various conductive lines in the M3 level are disposed over various vias in the via_2 level.

As shown in FIGS. 5H and 5I, vias 332 are connected to CVss pads 328, which electrically connects source contacts 310C and 310D (e.g., source contacts for pull-down transistors PD-1 or PD-2) to CVss lines 334. Thus, SRAM cell 10 includes CVss nodes 106 and 108 (see also FIG. 1), which include vias 332. CVss lines nodes 106 and 108 may further extend into and shared with neighboring SRAM cells in a different column and/or row that abut SRAM cell 10. In an embodiment, SRAM cells in a same row share one or more continuous CVss lines 334. The CVss lines 334 have longitudinal directions in the Y direction.

Furthermore, as illustrated in FIGS. 5A and 5I, the SRAM cell 10 has a first cell height. In some embodiments, the first cell height is determined by the minimum possible cell height for the SRAM cell 10. In other embodiments, the first cell height is determined based on the optimum cell height for logic cells that is then applied to the SRAM cell 10 to synchronize the cell heights of both the SRAM and logic cells on the semiconductor chip.

Additional overlying metal and via layers may be formed on the layout of FIG. 5I, such as via_2 level, M3 level, via_3 level, and M4 level (see FIG. 3). These additional metal levels may include additional word lines, CVss lines, CVdd lines, bit lines, etc. that may be used to provide additional interconnections between the SRAM cells and/or logic cells.

Figure 6:
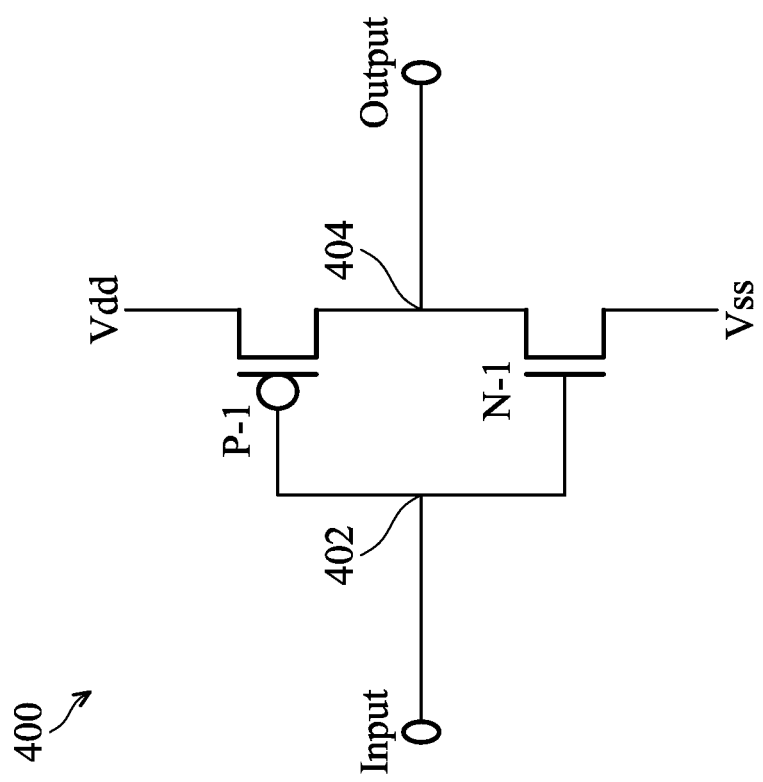
FIG. 6 illustrates a circuit diagram of a logic cell in accordance with some embodiments.

FIG. 6 illustrates a circuit diagram of a logic cell 400 in accordance with some embodiments. In this embodiment, the logic cell 400 is an inverter. The inverter cell 400 is powered through a positive power supply node Vdd that has a positive power supply voltage. The inverter cell 400 is also connected to power supply voltage Vss, which may be an electrical ground. The inverter 400 includes a PMOS transistor P-1 and an NMOS transistor N-1. The gates of the P-1 and N-1 transistors are coupled together at node 402. The Input of the inverter cell 400 is coupled to the node 402. The source of the P-1 transistor is coupled to the Vdd node and the source of the N-1 transistor is coupled to the Vss node.

The drains of the P-1 and N-1 transistors are coupled together at node 404. The Output of the inverter cell 400 is coupled to the node 404.

Figure 7:
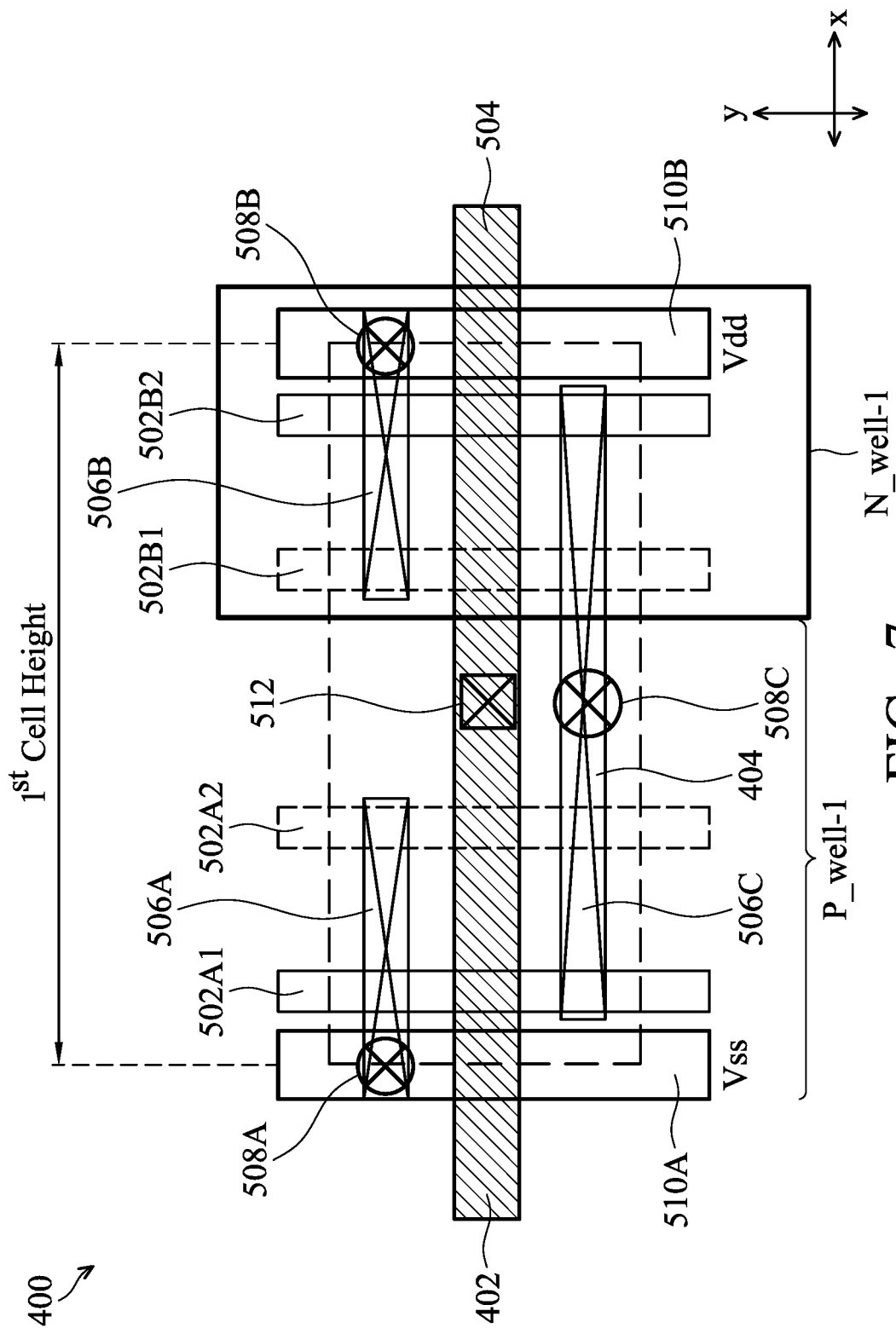
FIG. 7 illustrates a logic cell layout in accordance with some embodiments.

FIG. 7 illustrates a logic cell layout in accordance with some embodiments. FIG. 7 illustrates features in different levels of the inverter cell 400 (e.g., active region level, contact level, via_0 level, see FIG. 3), which are consecutively described for clarity.

Referring first to FIG. 7, features in the active region level (FIG. 3) and overlying gate electrodes of various transistors in inverter cell 400 are illustrated. The active region level includes a substrate, isolation regions, and well regions. In some embodiments, an N-well region is adjacent a P-well region. The formation and materials of the substrate, isolation regions, and well regions are similar to those described above in reference to FIG. 5A and the descriptions are not repeated herein.

Gate electrode 504 form transistor N-1 with underlying active regions 502A1 and 502A1 in the P-well region. In an embodiment, active regions 502A1 and 502A2, are fin-based and include one or more fin structures disposed under gate electrode 504 (e.g., gate electrode 504 may be disposed over and extend along sidewalls of active regions 502A1 and 502A2). Gate electrode 504 further forms transistor P-1 with underlying active regions 502B1 and 502B2 in the N-well region. In an embodiment, active regions 502B1 and 502B2 are fin-based and include one or more continuous fin structures disposed under gate electrode 504 (e.g., gate electrode 504 may be disposed over and extend along sidewalls of active regions 502B1 and 502B2). FIG. 7 illustrates a single fin for each active region 502A1 through 502B2 in accordance with some embodiments. In accordance with other embodiments, there may be a single fin, two fins, three fins, or more for each active region 502A1 through 502B2, and the number of fins in each active region 502A1 through 502B2 may be the same or different as other active regions in inverter cell 400. The formation and materials of the active regions 502 and gate electrode 504 are similar to those described above in reference to FIG. 5A and the descriptions are not repeated herein.

As further shown in FIG. 7, Vss node (see also FIG. 6) includes source/drain contact plug 506A, which is at the contact level of inverter cell 400 (see FIG. 3). Source/drain contact plug 506A is elongated and has a longitudinal direction in the X direction, which is parallel to the extending directions of gate electrode 504. Source/drain contact plug 506A comprises portions over and electrically connected to source/drains of active regions 502A1 and 502A2.

Vdd node (see FIG. 6) includes source/drain contact plug 506B. Since Vss node may be symmetric to Vdd node, the details source/drain contact plug 506B may be similar to source/drain contact plug 506A, respectively, and are not repeated herein for simplicity. Source/drain contact plug 506B comprises portions over and electrically connected to source/drains of active regions 502B1 and 502B2.

Node 404 (see FIG. 6) includes source/drain contact plug 506C, which is at the contact level of inverter cell 400 (see FIG. 3). Source/drain contact plug 506C is elongated and has a longitudinal direction in the X direction, which is parallel to the extending directions of gate electrode 504. Source/drain contact plug 506C comprises portions over and electrically connected to source/drains of active regions 502A1, 502A2, 502B1, and 502B2.

FIG. 7 also illustrates a gate contact 512 connected to gate electrode 504 which may be used to electrically couple gate electrode 504 to node 402 and to one or more conductive features overlying the gate electrode that can be used to input a signal into the inverter cell 400.

FIG. 7 further illustrates features of inverter cell 400 in the via_0 and M1 levels (see FIG. 3). In FIG. 7, vias 508 (labeled 508A through 508C) are disposed in the via_0 level (see FIG. 3) while Vss line 510A and Vdd line 510d are disposed in the M1 level (see FIG. 3). For example, various conductive lines in the M1 level are disposed over various vias in the via_0 level.

As shown in FIG. 7, via 508A is connected to source/drain contact 506A (e.g., source/drain contacts for transistor N-1). Via 508A is used to electrically couple source/drains of transistor N-1 to Vss line 510A.

Via 508B is connected to source/drain contact 506B (e.g., source/drain contacts for transistor P-1). Via 508B is used to electrically couple source/drains of transistor P-1 to Vdd line 510A.

Via 508C is connected to source/drain contact 506C (e.g., source/drain contacts for transistors P-1 and N-1). Via 508C is used to electrically couple source/drains of transistors P-1 and N-1 to node 404 and the Output of the inverter cell 400.

Furthermore, logic cells may be arranged in an array and may share a continuous Vss 510A and a continuous Vdd 510B. For example, the portion of Vss 510A and Vdd 510B and in the illustrated inverter cell 400 may be connected to portions of Vss 510A and Vdd 510B in other logic cells within the same column or row to form a continuous Vss and a continuous Vdd for each row or column of the logic cell array.

Further, as illustrated in FIGS. 5A, 5I, and 7, the SRAM cell 10 and the inverter cell 400 have the same first cell height. In some embodiments, the first cell heights are synchronized by determining by the minimum possible cell height for the SRAM cell 10 and applying that determined cell height to the logic cells. In other embodiments, the first cell height is determined based on the optimum cell height for the inverter cell 400 that is then applied to the SRAM cell 10 to synchronize the cell heights of both the SRAM and logic cells on the semiconductor chip. Moreover, in some embodiments, the layouts of SRAM cell and the logic cells are further synchronized to have the same number of active regions (see SRAM cell 10 with four fins and logic cell 400 with four fins). Even further, in some embodiments, the layouts of SRAM cell and the logic cells are further synchronized to both have elongated source/drain contacts that have a longitudinal directions in the X direction. These synchronizations between SRAM cells and logic cells shortens the module process development time, makes it easier to leverage technical knowledge between memory and logic cells, and makes it easier to maintain yield during production due to similar designs of memory and logic cells.

Figure 8:
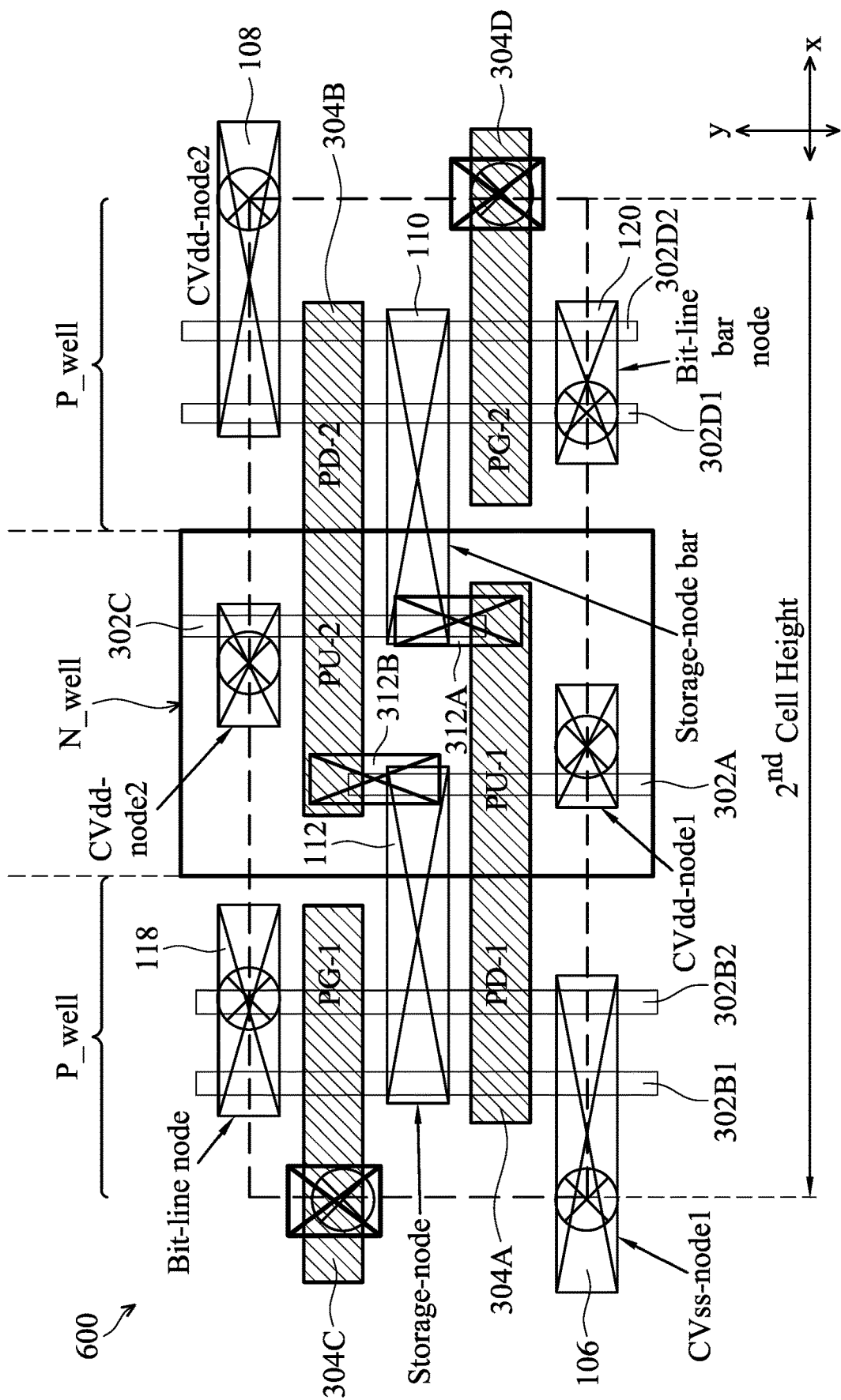
FIG. 8 illustrates an SRAM cell layout in accordance with some embodiments.

FIG. 8 illustrates an SRAM cell 600 layout in accordance with some embodiments. This embodiment is similar to the previous SRAM cell 10 embodiment of FIGS. 5A through 5I except that in this embodiment, the SRAM cell 600 includes six total active regions 302 (labeled as 302A through 302D2). Details regarding this embodiment that are similar to those for the previously described embodiment will not be repeated herein.

The active regions 302A, 302B1, 302B2, 302C, 302D1, and 302D2 may be formed of similar materials and by similar processes as those described above and the descriptions are not repeated herein. In this embodiment, the pull-down transistor PD-1 includes two active regions 302B1 and 302B2 (e.g. fins 302B1 and 302B2), the pass-gate transistor PG-1 includes two active regions 302B1 and 302B2 (e.g. fins 302B1 and 302B2), the pull-down transistor PD-2 includes two active regions 302D1 and 302D2 (e.g. fins 302D1 and 302D2), and the pass-gate transistor PG-2 includes two active regions 302D1 and 302D2 (e.g. fins 302D1 and 302D2). In some embodiments, the SRAM cell 600 is referred to as a high-performance SRAM cell and the SRAM cell 10 is referred to as a high density SRAM cell because the SRAM cell 600 has more active regions and can handle higher current and the SRAM cell 10 is has a smaller cell area and can be more densely packed onto a chip. Although FIG. 8 only shows the conductive features from the active region level through the via_0 level, the remaining levels (e.g. M1 level through M4 level) (see FIG. 3) will be subsequently formed as described above in the SRAM cell 10 embodiment.

Figure 9:
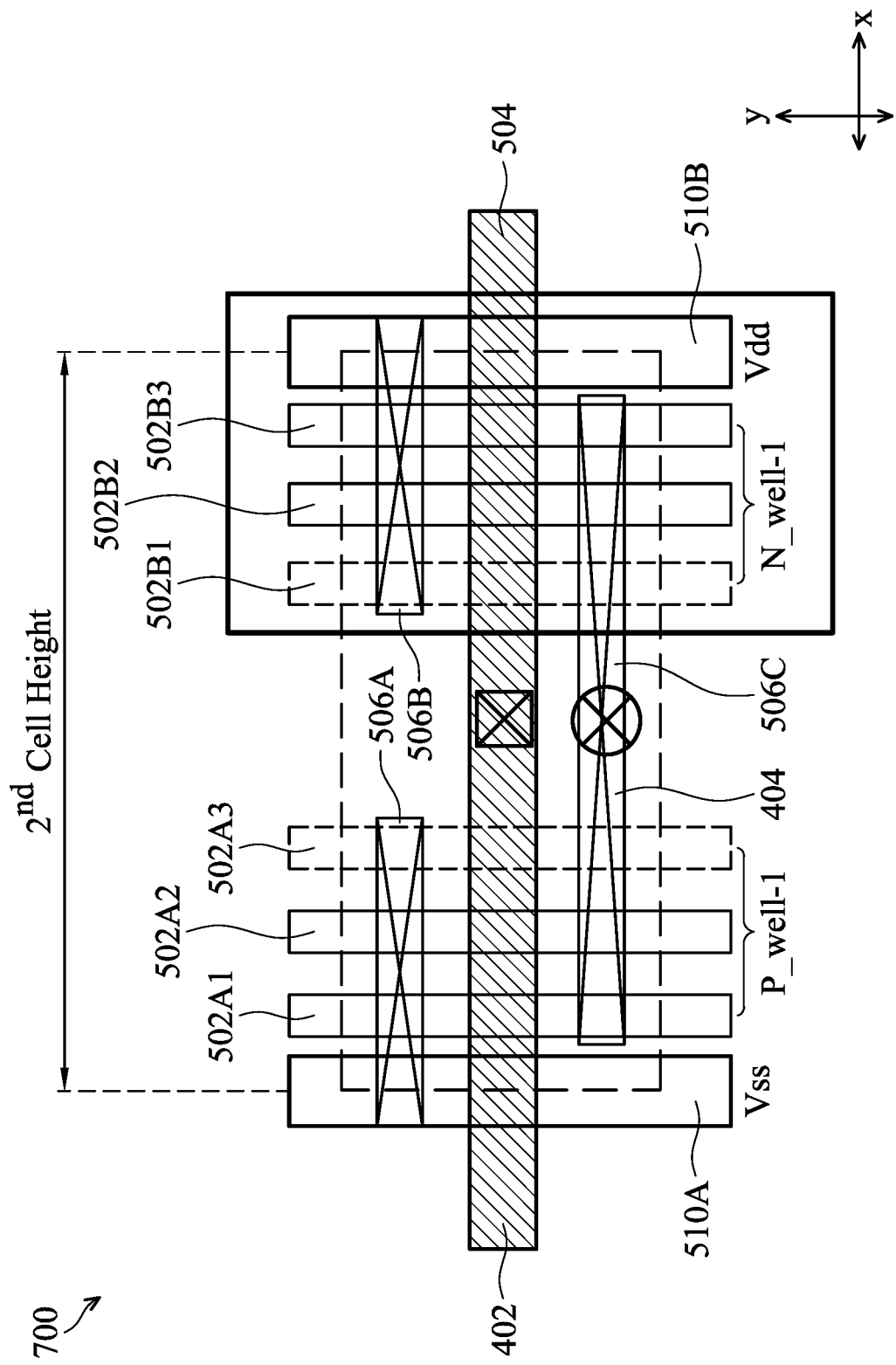
FIG. 9 illustrates a logic cell layout in accordance with some embodiments.

FIG. 9 illustrates a logic cell 700 layout in accordance with some embodiments. This embodiment is similar to the previous logic cell 400 embodiment of FIG. 7 except that in this embodiment, the logic cell 700 includes up to six total active regions 502 (labeled as 502A1 through 502B3). Details regarding this embodiment that are similar to those for the previously described embodiment will not be repeated herein.

The active regions 502A1, 502A2, 502A3, 502B1, 502B2, and 502B3 may be formed of similar materials and by similar processes as those described above and the descriptions are not repeated herein. In this embodiment, the transistor N-1 includes up to three active regions 502A1, 502A2, and 502A3 (e.g. fins 502A1, 502A2, and 502A3) and transistor P-1 includes up to three active regions 502B1, 502B2, and 502B3 (e.g. fins 502B1, 502B2, and 502B3).

Furthermore, as illustrated in FIGS. 8 and 9, the SRAM cell 600 has second cell height and the logic cell 700 has the second cell height. In some embodiments, the second cell height is determined by the minimum possible cell height for the SRAM cell 6000. In other embodiments, the second cell height is determined based on the optimum cell height for logic cells that is then applied to the SRAM cell 60 to synchronize the cell heights of both the SRAM and logic cells on the semiconductor chip.

Moreover, although FIGS. 6, 7, and 9 are described in a particular context of an inverter logic cell, other embodiments may also be applied to other logic cell configurations, such as, NAND gates, NOR gates, multiplexers, latches, flip-flops, or the like.

According to embodiments disclosed herein, SRAM memory cell layouts and logic cell layouts having synchronized cell designs are presented to shorten the learning cycle for module process development for a new technology node. For example, the synchronization of the cell design may include synchronizing the cell heights, synchronizing the pattern designs for layers, and/or synchronizing the number of fins per cell. This synchronization of the cell designs between memory cells and logic cells shortens the module process development time, makes it easier to leverage technical knowledge between memory and logic cells, and makes it easier to maintain yield during production due to similar designs of memory and logic cells.

An embodiment is a semiconductor device including a first static random access memory (SRAM) array including a plurality of SRAM cells, each of the plurality of SRAM cells having a first cell height, and a first logic cell outside of the first SRAM array, the first logic cell having the first cell height.

Another embodiment is an integrated circuit structure including a static random access memory (SRAM) cell having a first number of semiconductor fins, the SRAM cell having a first boundary and a second boundary parallel to each other, and a third boundary and a fourth boundary parallel to each other, the SRAM cell having a first cell height as measured from the third boundary to the fourth boundary, and a logic cell having the first number of semiconductor fins and the first cell height.

A further embodiment is a method including forming a first static random access memory (SRAM) array in a first semiconductor device including a plurality of SRAM cells, each of the plurality of SRAM cells having a first number of semiconductor fins, the SRAM cell having a first boundary and a second boundary parallel to each other, and a third boundary and a fourth boundary parallel to each other, the SRAM cell having a first cell height as measured from the third boundary to the fourth boundary, and forming a logic cell in the first semiconductor device having the first number of semiconductor fins and the first cell height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a memory array by forming a plurality of memory cells in rows and columns;
    forming dummy cells along a first boundary of the memory array and along a second boundary of the memory array, the first boundary being parallel to the second boundary; and
    forming a logic circuit by forming a plurality of logic cells along a third boundary of the memory array, wherein the third boundary is perpendicular to the first boundary, wherein the plurality of memory cells and the plurality of logic cells have a same cell height measured along a first direction from the first boundary to the second boundary.

2. The method of claim 1, further comprising forming strap cells along the third boundary of the memory array and along a fourth boundary of the memory array, the fourth boundary being parallel to the third boundary.

3. The method of claim 2, wherein each row of memory cells in the memory array is formed between a respective first dummy cell at the first boundary and a respective second dummy cell at the second boundary.

4. The method of claim 3, wherein each column of memory cells in the memory array is formed between a respective first strap cell at the third boundary and a respective second strap cell at the fourth boundary.

5. The method of claim 1, further comprising forming a bit line (BL) and a bit line bar (BLB) over and electrically coupled to each column of memory cells, wherein the BL and the BLB extend along a second direction perpendicular to the first direction.

6. The method of claim 5, wherein the BL and the BLB are formed to be electrically coupled to the logic circuit.

7. The method of claim 1, wherein each of the plurality of memory cells is formed to have a first number of semiconductor fins, and each of the plurality of the logic cells is formed to have a second number of semiconductor fins, wherein the first number is a same as the second number.

8. The method of claim 7, wherein the first number of semiconductor fins and the second number of semiconductor fins extend parallel to each other, wherein longitudinal axes of the first number of semiconductor fins are perpendicular to the first direction.

9. The method of claim 1, wherein each of the plurality of memory cells comprises:
   a first pull-up transistor and a second pull-up transistor;
   a first pull-down transistor and a second pull-down transistor that form cross-latched inverters with the first pull-up transistor and the second pull-up transistor;
   a first pass-gate transistor having a first source electrically connected to drains of the first pull-up transistor and the first pull-down transistor; and
   a second pass-gate transistor having a second source electrically connected to drains of the second pull-up transistor and the second pull-down transistor.

10. The method of claim 9, wherein gates of the first pass-gate transistor and the second pass-gate transistor are electrically connected to a word line, wherein a first drain of the first pass-gate transistor is electrically connected to a bit line (BL), and a second drain of the second pass-gate transistor is electrically connected to a bit line bar (BLB).

11. The method of claim 9, wherein each of the plurality of logic cells comprises:
   a first transistor, wherein a first source of the first transistor is coupled to a power supply node; and
   a second transistor, wherein a second source of the second transistor is coupled to a reference voltage node, wherein a first drain of the first transistor and a second drain of the second transistor are connected at a first node, wherein a gate of the first transistor and a gate of the second transistor are connected at a second node.

12. The method of claim 11, wherein the first transistor is a P-type transistor, and the second transistor is an N-type transistor.

13. A method of forming a semiconductor device, the method comprising:
   forming a memory cell in a memory region of the semiconductor device, wherein forming the memory cell comprises:
      forming a first fin in a first P-well region of the semiconductor device;
      forming a second fin in a second P-well region of the semiconductor device;
      forming, in a first N-well region of the semiconductor device disposed between the first P-well region and the second P-well region, a third fin and a fourth fin, wherein the first fin, the second fin, the third fin, and the fourth fin extend parallel to each other along a first direction, wherein the memory cell has a first cell height measured along the first direction; and
   forming a logic cell adjacent to the memory cell, wherein forming the logic cell comprises:
      forming, in a second N-well region of the semiconductor device, a fifth fin and a sixth fin; and
      forming, in a third P-well region of semiconductor device, a seventh fin and an eighth fin, wherein the fifth fin, the sixth fin, the seventh fin, and the eighth fin extend parallel to the first fin, wherein the logic cell has a second cell height measured along the first direction, the second cell height being equal to the first cell height.

14. The method of claim 13, wherein forming the memory cell further comprises:
   forming a first gate electrode extending along the first direction; and
   forming a second gate electrode extending in parallel to the first gate electrode, wherein in a top view, the first gate electrode overlaps with the first fin, the third fin, and the fourth fin, and the second gate electrode overlaps with the second fin, the third fin, and the fourth fin.

15. The method of claim 14, wherein forming the memory cell further comprises:
   forming a third gate electrode extending along the first direction; and
   forming a fourth gate electrode extending along the first direction, wherein in the top view, the third gate electrode overlaps with the second fin, and the second gate electrode overlaps with the first fin.

16. The method of claim 14, wherein forming the logic cell further comprises forming a third gate electrode extending along the first direction, wherein in the top view, the third gate electrode overlaps with the fifth fin, the sixth fin, the seventh fin, and the eighth fin.

17. A method of forming a semiconductor device, the method comprising:
   determining a first cell height for a first design of a static random access memory (SRAM) cell;
   applying the first cell height of the SRAM cell to a second design of a logic cell such that the first cell height of the SRAM cell is used as a second cell height of the logic cell;
   forming the SRAM cell in a memory region of the semiconductor device in accordance with the first design; and
   forming the logic cell in a control circuit region of the semiconductor device in accordance with the second design, the logic cell formed having a same cell height as the SRAM cell formed.

18. The method of claim 17, further comprising, before forming the SRAM cell and before forming the logic cell:
   determining a first number of semiconductor fins for the first design of the SRAM cell; and
   synchronizing the second design of the logic cell with the first design of the SRAM cell such that the second design and the first design have the first number of semiconductor fins.

19. The method of claim 17, wherein the first cell height is determined based on a minimum cell height for the SRAM cell.

20. The method of claim 17, wherein the first cell height is determined based on an optimum cell height for the SRAM cell.

* * * * *